United States Patent Office 3,243,314

Patented Mar. 29, 1966

3,243,314

SILICON OXIDE FILM FORMATION

Herbert S. Lehman, William A. Pliskin, and Rudy L. Ruggles, Jr., Poughkeepsie, N.Y., assignors to International Business Machines Corporation, New York, N.Y., a corporation of New York No Drawing. Filed Sept. 14, 1962, Ser. No. 223,804
2 Claims. (Cl. 117—201)

This invention relates to silicon oxide films, and, more particularly, to the densification of pyrolytic silicon oxide films.

Surface passivated semiconductor devices have been made in the past with thermally grown, inorganic silicon dioxide films. The desired surface is exposed to an oxidizing atmosphere such as steam maintained at a relatively high temperature for an extended period of time. The resultant thermally grown film, because it is highly impervious to moisture and impurity penetration, stabilizes the electrical parameters of the device. Although this procedure is satisfactory for some semiconductor devices, it has been observed to have deleterious effects on high speed devices, particularly when oxide films several thousand angstroms in thickness are grown.

The time required at temperature to thermally grow a film is sufficient, in many instances, to cause the transition regions between zones of different conductivity to move from their designated positions. This motion brings about a change in the base width and in the other device parameters, and, in a high speed device, may be highly detrimental.

Efforts have been made in the art toward growing silicon oxide films from a pyrolytic oxidation reaction. An organic siloxane compound which thermally decomposes to provide a silicon dioxide film is passed over the surface to be passivated. The surface is coated with pyrolytic silicon oxide at lower temperatures and in shorter times than with thermally grown film. These efforts have been reduced in effectiveness due to the formation of a more open or less dense oxide structure and to the formation of terminal hydroxyl groups on the pyrolytic oxide film which serve as active sites for contamination with moisture and other impurities. It has been the object of considerable research, therefore, to provide a pyrolytic film with the passivation characteristics of a thermally grown silicon oxide film.

Accordingly, it is an object of this invention to provide a process for densifying silicon oxide film.

It is a further object of this invention to provide a process for reducing, in a relatively short time, the moisture and contaminant sensitive hydroxyl groups on a pyrolytic silicon oxide film.

It is another object of this invention to provide a pyrolytic silicon oxide film which is highly impervious to moisture and impurity penetration.

It is still a further object of this invention to provide a pyrolytic silicon oxide film with improved electrical passivation characteristics.

The foregoing and other objects, features and advantages of the invention will be apparent from the following more particular description of preferred embodiments of the invention.

We have discovered that densifying a pyrolytic silicon oxide film, in accordance with our invention, removes the moisture and contaminant sensitive hydroxyl groups from the film and furnishes the film with desirable passivating characteristics. This is accomplished in a relatively short time without the attendant disadvantages usually accompanied by long exposure at high temperature. The completely densified pyrolytic oxide film is essentially indistinguishable, in this respect, from thermally grown silicon oxide film.

According to the practice of the present invention, a densified pyrolytic oxide film is provided by exposing the pyrolytic film to a controlled atmosphere maintained at a temperature above 800° C. for a relatively short period of time. There is no upper limit for temperature save that of the melting temperature of the oxide and the device, and the temperature at which detrimental region movement occurs. However, it is preferable, in most instances, to operate within a temperature range between 800 to 1000° C. for a period between 5 to 15 minutes.

Steam, oxygen, nitrogen, inert gas and vacuum anneal are available as the controlled atmosphere for densifying pyrolytic silicon dioxide film. The treatment may be in one of these, in an ambient comprising a mixture of these, or the film may be treated in several of these controlled atmospheres sequentially. By heating the pyrolytic silicon dioxide film in a controlled atmosphere for a selected period of time, silicon oxide film is produced with the density, structure, and passivating characteristics of oxide film thermally grown in steam at a 1000° C. Steam grown film is selected as a standard since it has the desired characteristics for passivating semiconductor devices.

In the table below, illustrations of specific examples are given to more fully describe the present invention. The densities presented in the table for the pyrolytic silicon dioxide film are given relative to oxide film thermally grown in steam at 1000° C. for the reasons heretofore explained.

*Table I*

| Sample | Treatment | | | Original Relative Density of Film | Final Relative Density of Film |
|---|---|---|---|---|---|
| | Ambient | Temp., ° C. | Time (minutes) | | |
| A | Helium | 800 | 15 | 0.95 | 0.965 |
| B | do | 800 | 15 | 0.95 | 0.971 |
| C | Argon | 800 | 15 | 0.90 | 0.98 |
| D | Steam | 800 | 15 | 0.90 | 1.00 |
| E | Helium | 850 | 5 | 0.95 | 0.975 |
| F | Steam | 850 | 5 | 0.95 | 0.987 |
| G | do | 850 | 15 | 0.94 | 1.00 |
| H | Nitrogen | 975 | 5 | 0.96 | 0.989 |
| I | Helium | 975 | 15 | 0.99 | 1.00 |
| J | Oxygen | 975 | 15 | 0.90 | 0.99 |
| K | Steam | 975 | 15 | 0.96 | 1.00 |

It was found that pyrolytic silicon dioxide films subjected, for a period of at least 5 minutes, to a controlled atmosphere maintained at a temperature of at least 800° C. results in nearly complete removal of surface hydroxyl groups. A structural examination by infra-red spectroscopy revealed that the pyrolytic oxides, which were steam treated, were indistinguishable from that of an oxide film thermally grown in steam at 1000° C., and, the pyrolytic oxides, which were treated in the other ambients, had a structure nearly the same as the thermally grown oxide.

Of all the ambients, steam is the most effective in producing an oxide film with properties similar to that of thermally grown film; however, treatment in any of the controlled ambients produces a reformed and densified structure with properties superior to that of the untreated pyrolytic oxide film. Therefore, in those instances where densification in an oxidizing atmosphere is not permissible, such as in the densification of pyrolytic films on a germanium surface or intermetallic compound surface, considerable densification is available in non-oxidizing ambients such as nitrogen, argon, helium or in any of the inert gases.

Although completely densified pyrolytic films are produced by exposing the film to steam, it is sometimes desirable to remove the last traces of surface hydroxyl groups by treatment in a water vapor free atmosphere.

To derive the benefits of the oxygen treatment, the pyrolytic silicon dioxide film is first treated in a controlled atmosphere of steam at a temperature above 800° C., and preferably in a range between 800 to 1000° C., for a period of 5 to 15 minutes. Thereafter, the film is further heated in a controlled atmosphere free of water vapor maintained at a temperature of at least 800° C. and preferably at a temperature in the range between 800 to 1000° C. for a period of at least 5 minutes. The water vapor free atmosphere may be furnished with oxygen, nitrogen, inert gas or a vacuum anneal.

The pyrolytic oxide films, densified in the examples described above, were formed on silicon wafers, ¾ to or 1 inch in diameter, from ethyl silicate, which was carried in an inert gas atmosphere, at a flow rate between ½ to 10 liters per minute, into a tube furnace maintained at a temperature between 675 and 725° C. The ethyl silicate disassociates at this temperature to deposit silicon dioxide on the silicon wafer. After the pyrolytic film was grown to about 1 micron in thickness the film was removed, cooled, and then densified with the controlled atmosphere. From an examination of these films it was found that the densified pyrolytic film is essentially indistinguishable from a thermally grown film. Pyrolytic oxide films have refractive indices before densification between 1.43 and 1.45 in comparison to 1.46 for thermally grown silicon dioxide films—the higher refractive index being indicative of a more dense structure. A 1% increase in refractive index corresponds to about 3.5% increase in density. Similarly, the frequency of the Si-O vibrational bands in the pyrolytic film, before densification, had band maxima at about 1080 to 1085 $cm.^{-1}$ and at 813 $cm.^{-1}$ in comparison to about 1097 $cm.^{-1}$ and 805 $cm.^{-1}$ for thermally grown film—the sharper band structure being indicative of more order in the film structure. After treatment for 5 minutes in accordance with the present invention, the refractive index, the frequency and shape of the vibrational bands for the pyrolytic film were similar to those obtained with the thermally grown film.

The pyrolytic silicon oxide film may be formed with any of a number of organic siloxane compounds provided the compound is heated to at least 600° C., the temperature at which siloxanes generally begin to decompose. Other siloxanes which may be utilized include: dimethyl diethoxysilane, tetraethoxysilane, amyl triethoxysilane, phenyl triethoxysilane, diphenyl diethoxysilane, and vinyl triethoxysilane.

The amount of densification required to enhance the pyrolytic film with the characteristics of thermally grown film is relatively small. This is readily seen when the passivating effectiveness of a densified pyrolytic film is compared to that of the non-densified pyrolytic film. The passivating effectiveness is evaluated by the stability of the device reverse current during high temperature steam exposure. Devices passivated with both densified and non-densified pyrolytic oxide were exposed to steam at a temperature of 400° C. for about thirty minutes. 95% of the devices with the non-densified, pyrolytic oxide exhibits increased reverse current of approximately five orders of magnitude; whereas only a relatively small number of the devices passivated with densified pyrolytic film exhibited increased reverse current, and the increases were only of two to three orders of magnitude.

With the present invention pyrolytic films are provided with characteristics heretofore only available with thermally grown film, thus making it possible to utilize pyrolytic films in ways previously not possible. Furthermore, although much of the discussion has been directed to the densification of pyrolytic silicon oxide films to provide passivating layers on semiconductor devices, a result which the invention is especially well adapted to produce, it is to be understood that the invention is also adapted to form densified pyrolytic oxide layers on devices and materials other than those of the semiconductor type. The method is well suited for reforming a pyrolytic film as a denser structure for oxide layers on refractories and other metals to form resistive, dielectric, and masking layers.

While the fundamental novel features of the invention have been shown and described as applied to preferred embodiments thereof, it will be understood that various omissions, substitutions and changes in the form and details of the invention illustrated, and in its utilization, may be made by those skilled in the art without departing from the spirit of the invention. It is the intention thereof, to be limited only as indicated by the scope of the following claims.

What is claimed:

1. The method of reducing moisture and contaminant sensitive hydroxyl groups on a pyrolytic silicon oxide film comprising the steps of:

exposing said film to a controlled atmosphere of steam maintained at a temperature in the range between 800 to 1000° C. for a period between 5 to 15 minutes to reform said film as a denser structure; and, thereafter, heating said film in a second controlled atmosphere free of water vapor, where said second controlled atmosphere is maintained at a temperature above 800° C. for a period of at least 5 minutes.

2. The method of reducing moisture and contaminant sensitive hydroxyl groups on a pyrolytically formed silicon oxide film by the steps comprising:

exposing said pyrolytically formed silicon oxide film to a controlled atmosphere, where said controlled atmosphere comprises a member and members selected from the group consisting of vacuum, steam, oxygen, nitrogen, and inert gas;

maintaining said controlled atmosphere at a temperature between 800° to 1000° C.; and, maintaining said pyrolytically formed silicon oxide film in said controlled atmosphere at said temperatures for a period between 5 to 15 minutes to reform said film as a denser structure and enhance it with characteristics of thermally grown film.

References Cited by the Examiner

UNITED STATES PATENTS

| | | | |
|---|---|---|---|
| 2,982,053 | 5/1961 | Elmer | 117—106 |
| 3,055,776 | 9/1962 | Stevenson et al. | 117—106 |
| 3,093,507 | 6/1963 | Lander et al. | 117—106 |
| 3,108,019 | 10/1963 | Davis | 117—62 |

OTHER REFERENCES

Ligenza: "J. of the Electrochemical Soc.," vol. 9, No. 2, February 1962, pp. 73–76.

Morrison et al.: J. of the Electrochemical Soc., vol. 109, No. 3, March 1962, pp. 221–225.

RICHARD D. NEVIUS, *Primary Examiner.*

W. L. JARVIS, *Assistant Examiner.*